US006961272B2

(12) United States Patent
Schreck

(10) Patent No.: US 6,961,272 B2
(45) Date of Patent: *Nov. 1, 2005

(54) PHYSICALLY ALTERNATING SENSE AMPLIFIER ACTIVATION

(75) Inventor: John Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/046,895

(22) Filed: Feb. 1, 2005

(65) Prior Publication Data

US 2005/0146962 A1 Jul. 7, 2005

Related U.S. Application Data

(63) Continuation of application No. 10/771,436, filed on Feb. 5, 2004, now Pat. No. 6,862,229, which is a continuation of application No. 10/075,763, filed on Feb. 15, 2002, now Pat. No. 6,707,729.

(51) Int. Cl.$^7$ .............................................. G11C 7/06
(52) U.S. Cl. .................. 365/196; 365/207; 365/230.03
(58) Field of Search ............................... 365/196, 207, 365/230.03

(56) References Cited

U.S. PATENT DOCUMENTS

| 5,042,011 | A | | 8/1991 | Casper et al. |
| 5,132,575 | A | | 7/1992 | Chern |
| 5,280,205 | A | | 1/1994 | Green et al. |
| 5,627,785 | A | | 5/1997 | Gilliam et al. |
| 5,671,188 | A | * | 9/1997 | Patel et al. ................. 365/205 |
| 5,761,142 | A | * | 6/1998 | Ikeda ......................... 365/207 |
| 5,822,262 | A | | 10/1998 | Hashimoto et al. |
| 5,831,912 | A | | 11/1998 | Mueller et al. |
| 6,483,763 | B2 | * | 11/2002 | Uchikoba et al. ........... 365/205 |

* cited by examiner

Primary Examiner—Richard Elms
Assistant Examiner—J. H. Hur
(74) Attorney, Agent, or Firm—Dickstein Shapiro Morin & Oshinsky LLP

(57) ABSTRACT

A memory device having banks of sense amplifiers comprising two types of sense amplifiers. A first driver used to activate the first type of sense amplifier is embedded into a first bank. A second driver used to activate a second type of sense amplifier is embedded into a second bank. This alternating physical placement of the first and second sense amplifier drivers within respective banks is repeated throughout the device. This alternating physical arrangement frees up the gaps and mini-gaps for other functions, reduces the buses used for sense amplifier activation signals and allows large drivers to be used, which improves the operation of the sense amplifiers and the device itself.

20 Claims, 9 Drawing Sheets

PHYSICALLY ALTERNATING SENSE AMPLIFIER ACTIVATION

This application is a continuation of application Ser. No. 10/771,436, filed on Feb. 5, 2004, now U.S. Pat. No. 6,862,229, which is a continuation of application Ser. No. 10/075,763, filed on Feb. 15, 2002, now U.S. Pat. No. 6,707,729, which are hereby incorporated by reference in their entirety.

FIELD OF THE INVENTION

The present invention relates to the field of semiconductor memory devices and, more particularly to a physically alternating sense amplifier activation scheme for a semiconductor memory device.

BACKGROUND OF THE INVENTION

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 10. Each cell 10 contains a storage capacitor 14 and an access field effect transistor or transfer device 12. For each cell, one side of the storage capacitor 14 is connected to a reference voltage (illustrated as a ground potential for convenience purposes). The other side of the storage capacitor 14 is connected to the drain of the transfer device 12. The gate of the transfer device 12 is connected to a signal known in the art as a word line 18. The source of the transfer device 12 is connected to a signal known in the art as a bit line 16 (also known in the art as a digit line). With the memory cell 10 components connected in this manner, it is apparent that the word line 18 controls access to the storage capacitor 14 by allowing or preventing the signal (representing a logic "0" or a logic "1") carried on the storage capacitor 14 to be read to or written from the bit line 16. Thus, each cell 10 contains one bit of data (i.e., a logic "0" or logic "1").

Referring to FIG. 2, an exemplary DRAM circuit 40 is illustrated. The DRAM 40 contains a memory array 42, row and column decoders 44, 48 and a sense amplifier circuit 46. The memory array 42 consists of a plurality of memory cells (constructed as illustrated in FIG. 1) whose word lines and bit lines are commonly arranged into rows and columns, respectively. The bit lines of the memory array 42 are connected to the sense amplifier circuit 46, while its word lines are connected to the row decoder 44. Address and control signals are input into the DRAM 40 and connected to the column decoder 48, sense amplifier circuit 46 and row decoder 44 and are used to gain read and write access, among other things, to the memory array 42.

The column decoder 48 is connected to the sense amplifier circuit 46 via control and column select signals. The sense amplifier circuit 46 receives input data destined for the memory array 42 and outputs data read from the memory array 42 over input/output (I/O) data lines. Data is read from the cells of the memory array 42 by activating a word line (via the row decoder 44), which couples all of the memory cells corresponding to that word line to respective bit lines, which define the columns of the array. One or more bit lines are also activated. When a particular word line is activated, the sense amplifier within circuit 46 that is connected to the proper bit lines (i.e., column) detects and amplifies the data bit transferred from the storage capacitor of the memory cell to its bit line by measuring the potential difference between the activated bit line and a reference line which may be an inactive bit line. The operation of DRAM sense amplifiers is described, for example, in U.S. Pat. Nos. 5,627,785; 5,280,205; and 5,042,011, all assigned to Micron Technology Inc., and incorporated by reference herein.

The sense amplifier circuit 46 used in DRAM devices is typically arranged as banks of individual sense amplifiers. Common connections are used to activate the banks of sense amplifiers. A bank of sense amplifiers has many, e.g., two hundred and fifty-six, sense amplifiers adjacent to each other. FIG. 3 illustrates a typical sense amplifier 46 found in a DRAM sense amplifier bank. The sense amplifier 46 includes four isolating transistors 80, 82, 88, 90, two input/output (I/O) transistors 84, 86, a p-sense amplifier circuit 70 and an n-sense amplifier circuit 60.

The first isolating transistor 80 is connected such that its source and drain terminals are connected between a first sense amp line SA and a first bit line $DL_a$. The first bit line $DL_a$ is also connected to memory cells (not shown) within the memory array 42 (FIG. 2). Similarly, the third isolating transistor 88 is connected such that its source and drain terminals are connected between the first sense amp line SA and a second bit line $DL_b$. The second bit line $DL_b$ is also connected to additional memory cells (not shown) within the memory array 42 (FIG. 2). The second isolating transistor 82 is connected such that its source and drain terminals are connected to a second sense amp line SA_ and a third bit line $Dl_{a\_}$, which during a sensing operation is typically driven to a complementary state relative to the first bit line $DL_a$. The third bit line $Dl_{a\_}$ is also connected to memory cells (not shown) within the memory array 42 (FIG. 2). The fourth isolating transistor 90 is connected such that its source and drain terminals are connected to the second sense amp line SA_ and a fourth bit line $Dl_{b\_}$. The fourth bit line $Dl_{b\_}$ is also connected to memory cells (not shown) within the memory array 42 (FIG. 2).

The gate terminal of the first and second isolating transistors 80, 82 are connected to a first isolation gating line $ISO_{a\_}$ while the gate terminal of the third and fourth isolating transistors 88, 90 are connected to a second isolation gating line $ISO_{b\_}$. All four of the isolating transistors 80, 82, 88, 90 are n-channel MOSFET (metal oxide semiconductor field effect transistor) transistors. The isolating transistors 80, 82, 88, 90 and the isolation gating lines $ISO_{a\_}$, $ISO_{b\_}$ form isolation devices. The normal state for the isolation gating lines $ISO_{a\_}$, $ISO_{b\_}$ is a high signal. For the sense amplifier 46 that is adjacent to the selected memory array 42, the isolating transistors 80, 82, 88, 90 that do not connect directly to the selected array are driven to ground (via the isolation gating lines $ISO_{a\_}$, $ISO_{b\_}$). This isolates the deselected array from the active sense amplifier.

The first I/O transistor 84 is connected between a first I/O line IO and the first sense amp line SA and has its gate terminal connected to a column select line CS. The second I/O transistor 86 is connected between a second I/O line IO_ and the second sense amp line SA_ and has its gate terminal connected to the column select line CS. The I/O transistors 84, 86 are also n-channel MOSPET transistors. The I/O lines IO, IO_ are used by the circuit 46 as a data path for input data (i.e., data being written to a memory cell) and output data (i.e., data being read from a memory cell). The data path is controlled by the column select line CS, which is activated by the column decoder circuitry 48 (FIG. 2) of the DRAM.

The p-sense amplifier circuit 70 includes two p-channel MOSFET transistors 72, 74. The n-sense amplifier circuit 60 includes two n-channel MOSFET transistors 62, 64. The first p-channel transistor 72 has its gate terminal connected to the second sense amp line SA_ and the gate terminal of the first n-channel transistor 62. The first p-channel transistor 72 is connected between the second p-channel transistor 74 and the first sense amp line SA. The second p-channel transistor 74 has its gate terminal connected to the first sense amp line SA and the gate terminal of the second n-channel transistor 64. The second p-channel transistor 74 is connected between the first p-channel transistor 72 and the second sense amp line SA_. A p-sense amplifier latching/activation signal ACT is applied at the connection of the two p-channel transistors 72, 74.

The first n-channel transistor 62 has its gate terminal connected to the second sense amp line SA_ and is connected between the second n-channel transistor 64 and the first sense amp line SA. The second n-channel transistor 64 has its gate terminal connected to the first sense amp line SA and is connected between the first n-channel transistor 62 and the second sense amp line SA_. An n-sense amplifier latching/activation signal RNL* is applied at the connection of the two n channel transistors 62, 64. The sensing and amplification of data from a memory cell is performed by the p-sense and n-sense amplifier circuits 70, 60, respectively controlled by the p-sense and n-sense activation signals ACT, RNL*, which work in conjunction to effectively read a data bit which was stored in a memory cell.

FIG. 4 illustrates an exemplary portion of the DRAM circuit 40 having banks of sense amplifiers $46_a$, $46_b$, $46_c$ and gaps $50_a$, $50_b$ between the sense amplifiers $46_a$, $46_b$, $46_c$. Although not shown, the two sense amplifier activating signals RNL* and ACT (described above with reference to FIG. 3) are typically generated by drivers located within the gaps $50_a$, $50_b$. FIG. 4 also illustrates three sub-arrays $42_a$, $42_b$, $42_c$ of memory cells and row drivers $52_a$, $52_b$, positioned between the sub-arrays $42_a$, $42_b$, $42_c$.

The gaps $50_a$, $50_b$ occupy a relatively small area of the DRAM 40 compared to the amount of circuitry (e.g., RNL* and ACT drivers) necessary to be designed in the gaps $50_a$, $50_b$. There are a number of design considerations that affect the gap design and the number of sense amplifiers in a bank of sense amplifiers. For example, the word line length is usually maximized to achieve the fewest number of decoders while still meeting the DRAM chip's performance requirements. If the word line is too long, then the RC delay becomes prohibitive. A second consideration is to keep the IR drop across the RNL* and ACT buses within acceptable limits. Both the RNL* and ACT signal lines are connected to buses that stretch into the gaps. The IR drop across these buses is a function of the number of sense amplifiers in the bank and the width of the RNL* and ACT buses. Because the area that a sense amplifier occupies is minimized, the width of the RNL* and ACT buses is constrained. A third consideration that will determine the number of sense amplifiers in a bank is the width of the RNL* and ACT drivers that are placed into the gaps. The greater the number of sense amplifiers, the greater the width of the drivers.

In some prior designs, one of the RNL* or ACT drivers is placed into the sense amplifier, while the other driver is placed into the gap. The area occupied by the sense amplifier increases, but this tradeoff may be made for many reasons: 1) additional driver size, i.e., a size beyond what could have fit into the gap, was needed and/or 2) busing requirements through the sense amplifier were large enough that the additional area required for the driver transistors was free. Once one of the drivers is embedded into the sense amplifier, there is exists more area in the gap for the other driver. This scheme, however, requires large sense amplifiers and circuitry in the gaps.

Placing the drivers into different gaps is another method that purportedly increases the widths of the RNL* and ACT drivers. That is, one gap would have the ACT driver and another gap would have the RNL* driver. This method reduces the amount of wasted chip area by separating the drivers. That is, because the ACT driver usually includes a p-channel transistor and the RNL* driver usually includes an n-channel transistor, there is a minimum spacing requirement between the drivers (i.e., transistors). This space requirement between the n-channel and p-channel transistors (if implemented adjacent each other) is a large wasteful area that could have been used for additional driver width. Having the drivers in different gaps reduces this problem, but it is not an optimal solution particularly in light of new DRAM architectures.

New DRAM architectures, ones employing global word lines, make it very difficult to have adequate device widths for the RNL* and ACT drivers. FIGS. 5 and 6 illustrate a typical global word line architecture/scheme 100 and a DRAM 140 implementing the scheme 100. In the global word line scheme 100, one large row decoder/driver 102 replaces the multiple repetitive decoders/drivers $52_a$, $52_b$ (FIG. 4) used in other DRAM architectures. The scheme 100 uses a metal global word line GLOBAL WL 118 and a series of polysilicon sub-word lines SUB WL $118_a$, $118_b$, $118_c$, $118_d$. In the global word line scheme 100, array breaks (or gaps) exist where the polysilicon sub-word lines SUB WL $118_a$, $118_b$, $118_c$, $118_d$ are strapped to the metal global word line GLOBAL WL 118.

The DRAM 140 implementing the global word line scheme 100 contains banks of sense amplifiers $46_a$, $46_b$, $46_c$, $46_d$, sub-arrays $42_a$, $42_b$, $42_c$, $42_d$ of memory cells, row drivers $152_a$, $152_b$, gaps $150_a$, $150_b$, mini-gaps $154_a$, $154_b$, $154_c$, $154_d$ and word line contact blocks $156_a$, $156_b$, $156_c$, $156_d$. The mini-gaps $154_a$, $154_b$, $154_c$, $154_d$ are much smaller than the gaps $150_a$, $150_b$ because they occur at the word line strapping areas (as a result of the global word line scheme 100). The mini-gaps $154_a$, $154_b$, $154_c$, $154_d$, unfortunately, are too small to contain adequately sized RNL* and ACT drivers. This forces the designer of the DRAM 140 to use inadequate sense amplifier drivers or to waste precious space on the chip to implement adequate ones.

Accordingly, there is a desire and need to implement adequately sized sense amplifier drivers that will improve sense amplifier operation in a DRAM memory device without wasting precious space in the device.

SUMMARY OF THE INVENTION

The present invention provides a DRAM memory device having relatively large sense amplifier drivers (i.e., RNL* and ACT drivers), which improve the operation of the device's sense amplifiers, reduce the size of the buses used for the sense amplifier activation signals and free up space in the device for additional functionality.

The above and other features and advantages are achieved by a memory device having banks of sense amplifiers comprising two types of sense amplifiers. A first driver used to activate the first type of sense amplifier is embedded into a first bank. A second driver used to activate a second type of sense amplifier is embedded into a second bank. No sense amplifier driver circuitry is contained within gaps or min-gaps between the banks of sense amplifiers. This alternating physical placement of the first and second sense amplifier drivers within respective banks is repeated throughout the device. This alternating physical arrangement frees up the gaps and mini-gaps for other functions, reduces the buses used for sense amplifier activation signals and allows large drivers to be used, which improves the operation of the sense amplifiers and the device itself.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

As set forth above, there is a desire and need to implement adequately sized ACT and RNL* drivers in a DRAM device. Proper sizing of these drivers will improve sense amplifier operation and operation of the DRAM device itself. It is also desirable to implement these drivers without wasting precious space in the device.

One possible solution is to embed both the ACT and RNL* drivers into each sense amplifier of the banks of sense amplifiers. Although it would be possible to obtain larger drivers, this scheme would take up an enormous amount of space in the device and is not desirable. Another possible solution is to alternate ACT driver embedded sense amplifiers and RNL* driver embedded sense amplifiers within the same bank of sense amplifiers. That is, within the same bank of sense amplifiers there will be sense amplifiers having the ACT driver and other sense amplifiers having the RNL* drivers embedded therein. The sense amplifiers are alternated within the bank such that each ACT driver embedded sense amplifier is adjacent (via a min-gap) an RNL* driver embedded sense amplifier.

Figure 1:
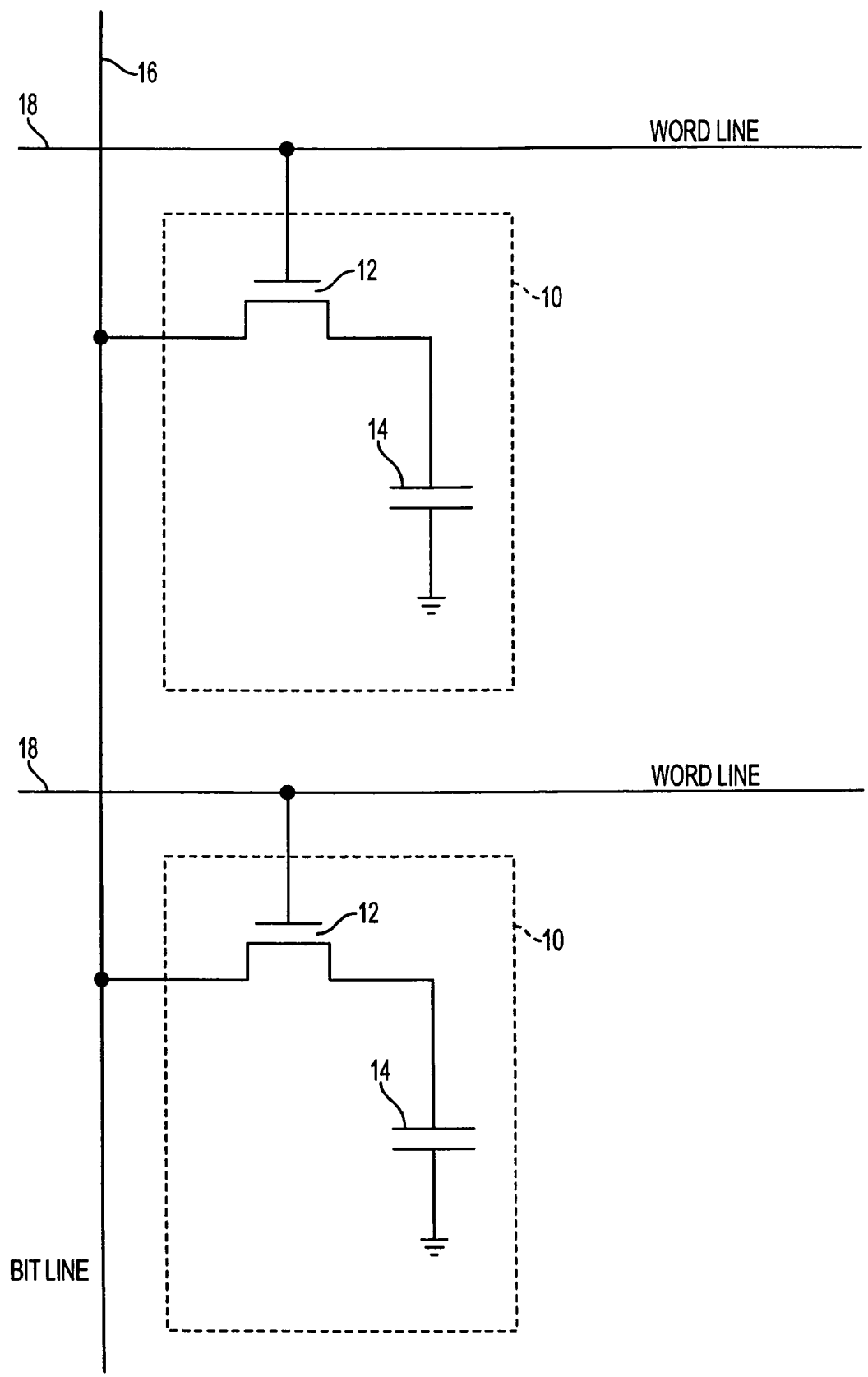
FIG. 1 is a circuit diagram illustrating conventional DRAM memory cells.
Figure 2:
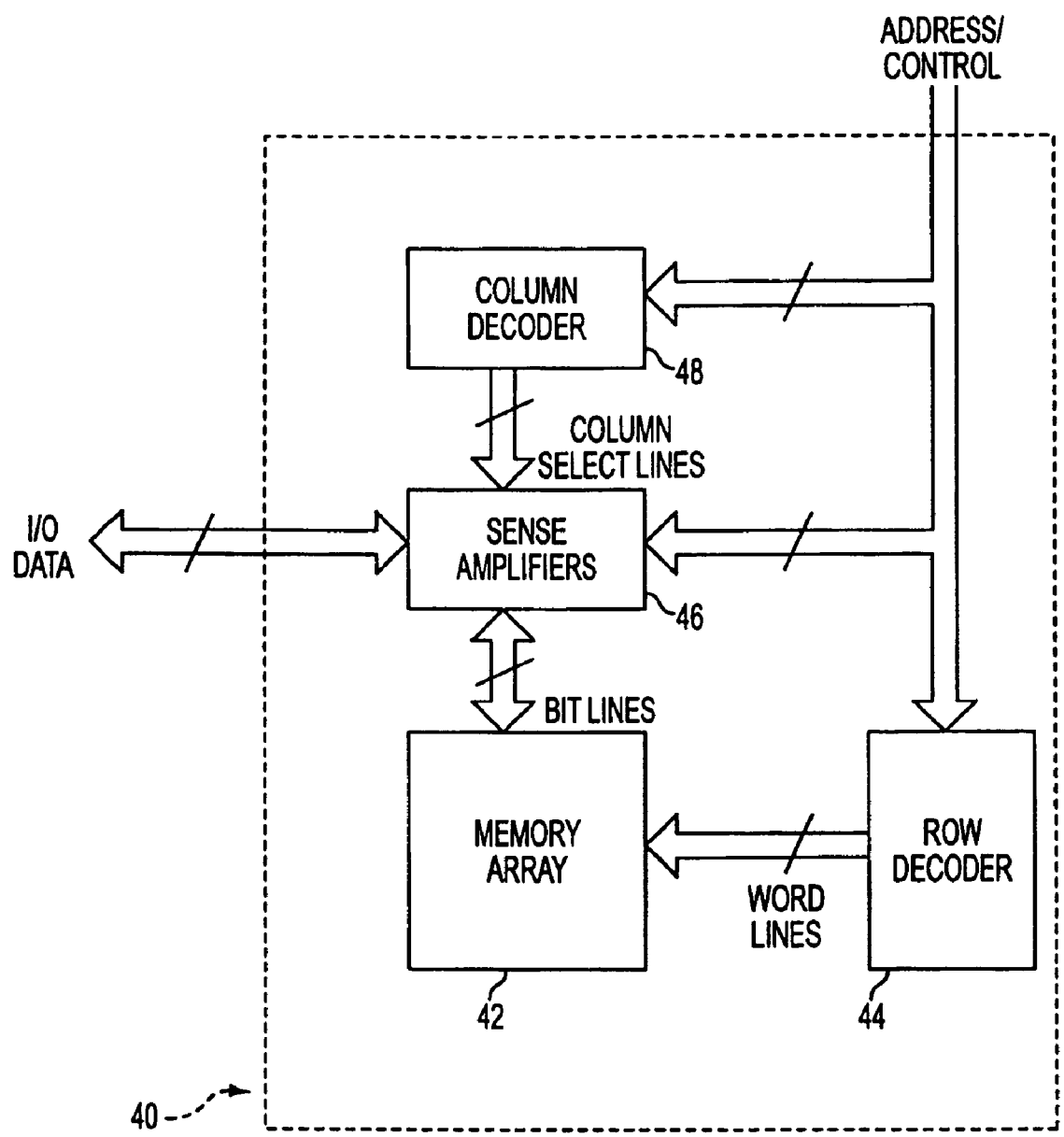
FIG. 2 is a functional block diagram illustrating a DRAM device.
Figure 3:
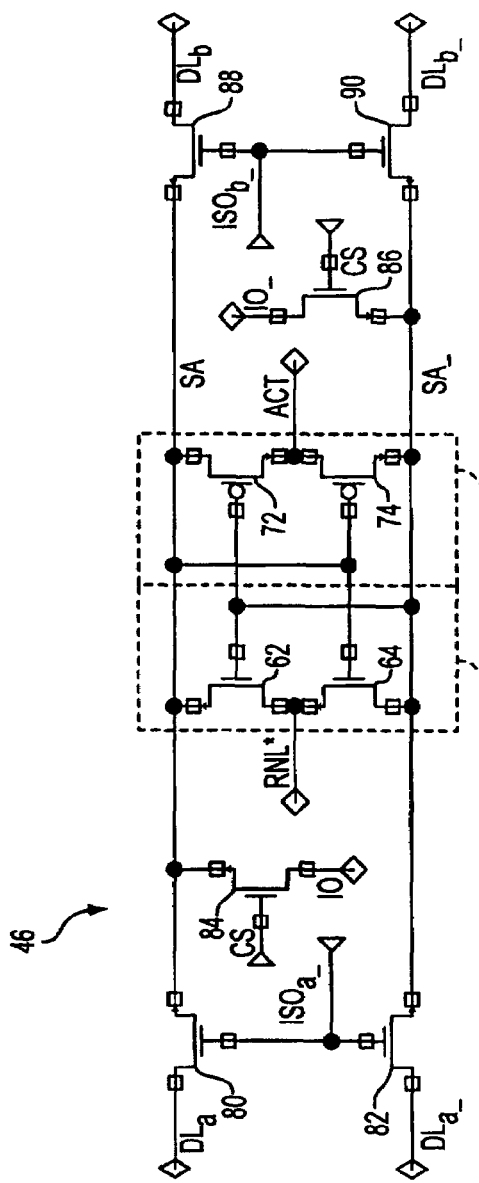
FIG. 3 is a circuit diagram illustrating a typical sense amplifier used in a DRAM device.
Figure 7:
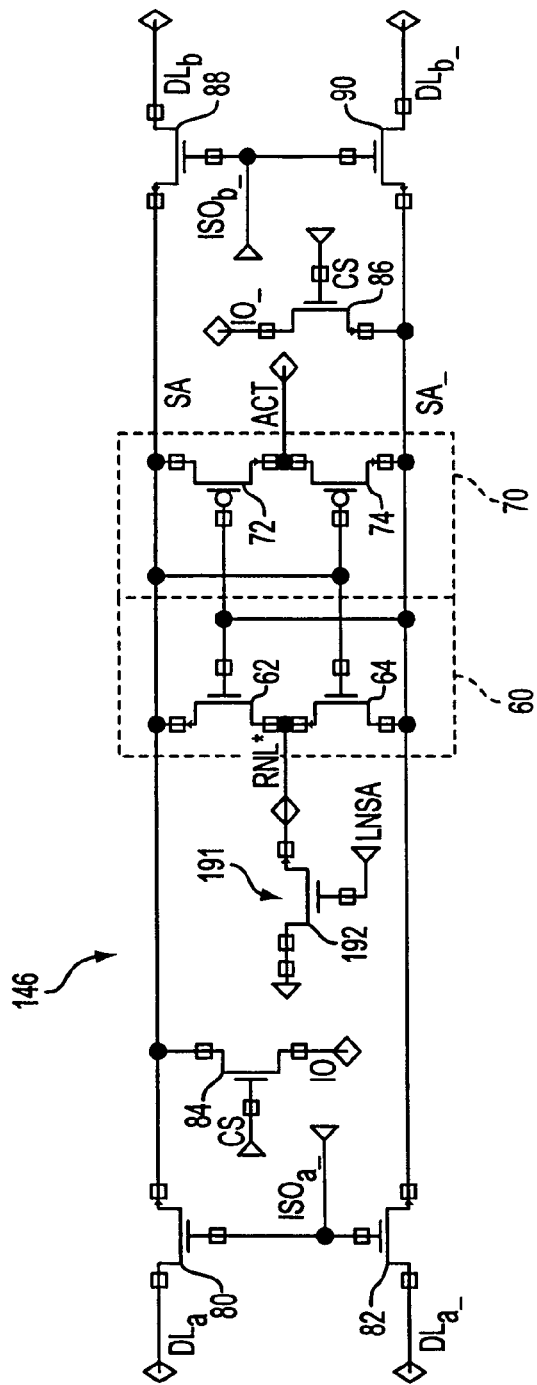
FIG. 7 is a circuit diagram illustrating an exemplary sense amplifier having an embedded RNL* driver.

FIG. 7 illustrates an exemplary sense amplifier 146 having an embedded RNL* driver 191. The RNL* driver 191 comprises an n-channel MOSFET transistor 192 having its gate terminal connected to an n-sense amplifier control signal LNSA that is generated by conventional control circuitry within the DRAM device. The transistor 192 is connected between a ground potential and the n-sense amplifier 60. The RNL* driver 191 generates a low potential (i.e., ground) n-sense amplifier activation signal RNL* when it receives the n-sense amplifier control signal LNSA. The n-sense amplifier activation signal RNL* is used to activate the n-sense amplifier 60. As is known in the art, the n-sense amplifier activation signal RNL* can be driven to Vcc/2 during precharge operations. The other components of the sense amplifier 146 are the same as the conventional sense amplifier 46 (FIG. 3) and are not described further.

Figure 8:
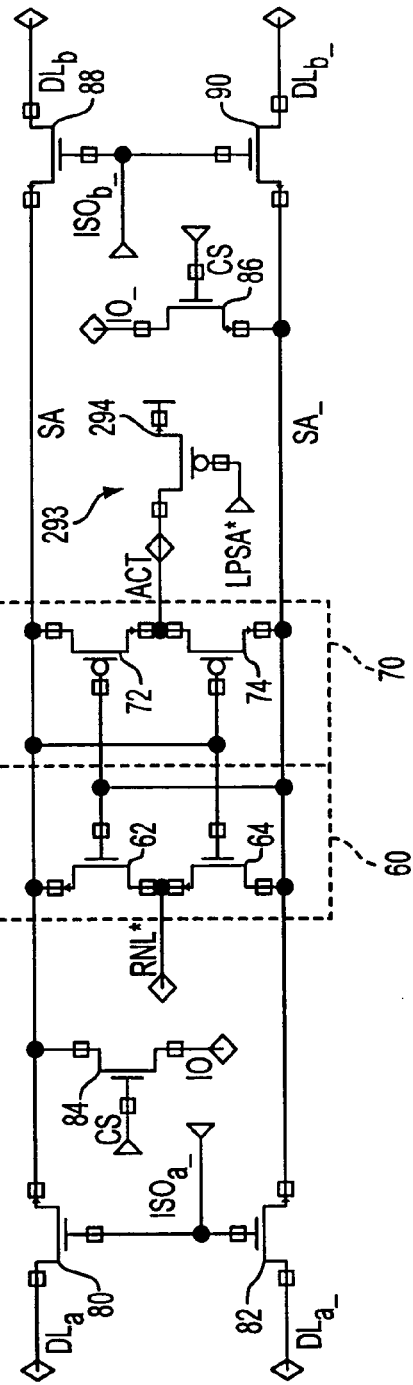
FIG. 8 is a circuit diagram illustrating an exemplary sense amplifier having an embedded ACT driver.

FIG. 8 illustrates an exemplary sense amplifier 246 having an embedded ACT driver 293. The ACT driver 293 comprises a p-channel MOSFET transistor 294 having its gate terminal connected to an p-sense amplifier control signal LPSA* that is generated by conventional control circuitry within the DRAM device. The transistor 294 is connected between a high potential (typically Vcc) and the p-sense amplifier 70. The ACT driver 293 generates the high potential (e.g., Vcc) p-sense amplifier activation signal ACT when it receives the p-sense amplifier control signal LPSA*. The p-sense amplifier activation signal ACT is used to activate the p-sense amplifier 70. As is known in the art, the p-sense amplifier activation signal ACT can be driven to ground during precharge operations. The other components of the sense amplifier 246 are the same as the conventional sense amplifier 46 (FIG. 3) and are not described further.

There is a problem with alternating ACT driver embedded sense amplifiers 246 and RNL* driver embedded sense amplifiers 146 in the same bank. The problem arises because the ACT driver embedded sense amplifiers 246 require transistors 294 with larger n-well width than the RNL* driver embedded sense amplifiers 146. Due to spacing requirements, there must be a minimum amount of space between the n-well edge of the ACT driver 293 and the n-channel transistor 192 of the RNL* driver 191. This prevents the two sense amplifiers 146, 246 from being physically adjacent to each other, which means more space is required to implement this type of scheme, rendering the solution sub-optimal. Thus, another solution is required.

Figure 9:
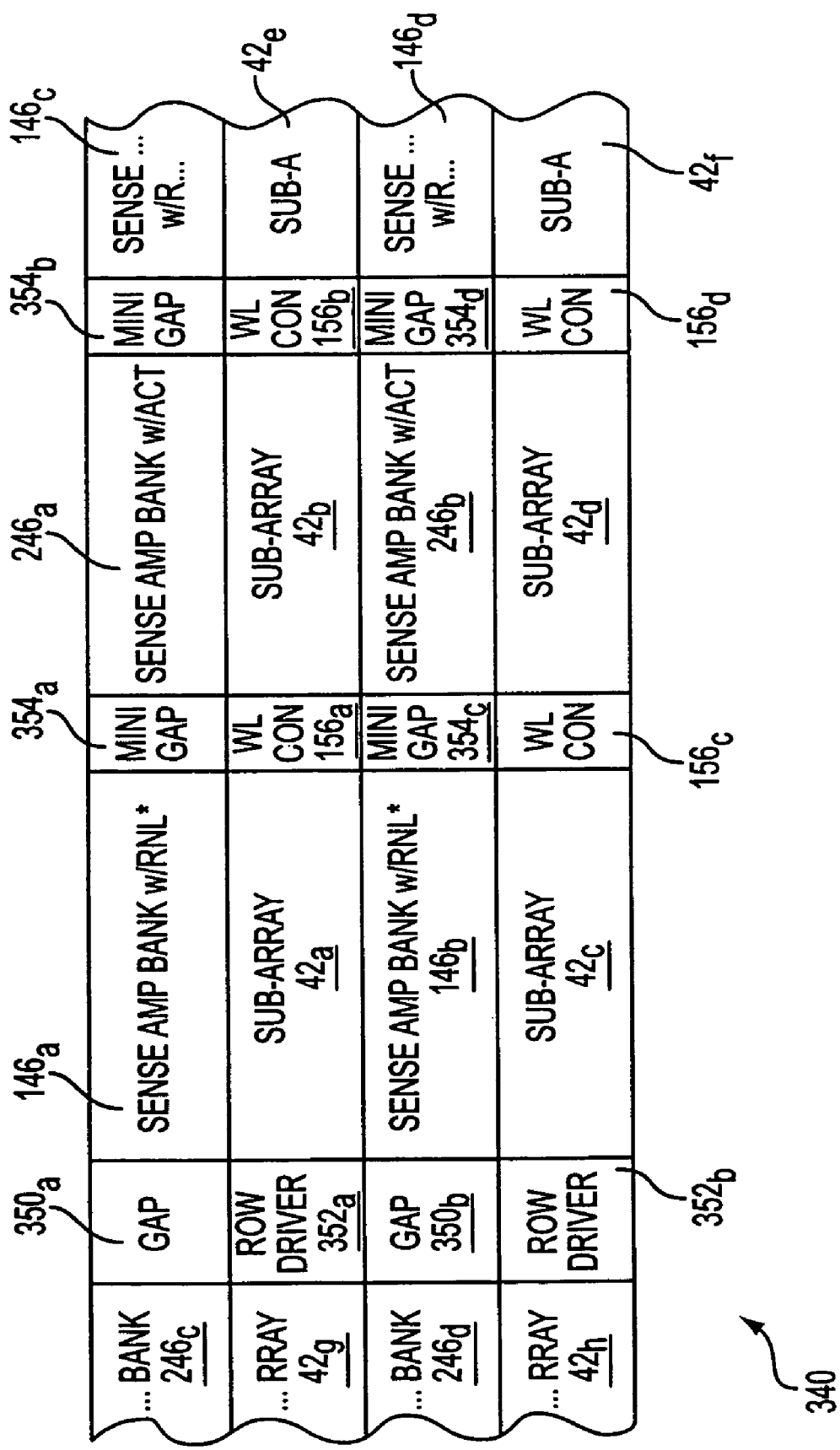
FIG. 9 is a block diagram illustrating an exemplary DRAM device constructed in accordance with an embodiment of the invention.

FIG. 9 is a block diagram illustrating an exemplary DRAM device 340 constructed in accordance with an embodiment of the invention. In the illustrated embodiment, both RNL* driver embedded sense amplifier banks $146_a$, $146_b$, $146_c$, $146_d$ and ACT driver embedded sense amplifier banks $246_a$, $246_b$, $246_c$, $246_d$ are physically alternated throughout the device 340. In the illustrated embodiment, the banks $146_a$, $146_b$, $146_c$, $146_d$, $246_a$, $246_b$, $246_c$, $246_d$ are physically alternated in the horizontal direction. For example, the top portion of the device 340 contains the third ACT driver embedded sense amplifier bank 246$_c$, the first RNL* driver embedded sense amplifier bank 146$_a$, the first ACT driver embedded sense amplifier bank 246$_a$, and the third RNL* driver embedded sense amplifier bank 146$_c$, positioned in the horizontal, left-to-right direction.

Each bank 146$_a$, 146$_b$, 146$_c$, 146$_d$ comprises a plurality of RNL* driver embedded sense amplifiers 146 (FIG. 7). Each bank 246$_a$, 246$_b$, 246$_c$, 246$_d$ comprises a plurality of ACT driver embedded sense amplifiers 246 (FIG. 8). Each bank 146$_a$, 146$_b$, 146$_c$, 146$_d$, 246$_a$, 246$_b$, 246$_c$, 246$_d$ may comprise two hundred and fifty-six RNL* and ACT embedded sense amplifiers 146, 246, respectively. It should be appreciated that the invention is not limited to any specific number of sense amplifiers used in the banks.

The physical alternation of the RNL* driver embedded sense amplifier banks 146$_a$, 146$_b$, 146$_c$ and ACT driver embedded sense amplifier banks 246$_a$, 246$_b$, 246$_c$ allows very large RNL* and ACT drivers 191, 293 (FIGS. 7 and 8) to be used because the driver circuitry is not placed within gaps 350$_a$, 350$_b$ or mini-gaps 354$_a$, 354$_b$, 254$_c$, 354$_d$. Moreover, since the embodiment uses the global word line scheme, the bus size for the n-sense amplifier activation signal RNL* and p-sense amplifier activation signal ACT can be very small, which leaves more area on the chip for power buses and other control signals routed over the sense amplifiers.

Figure 4:
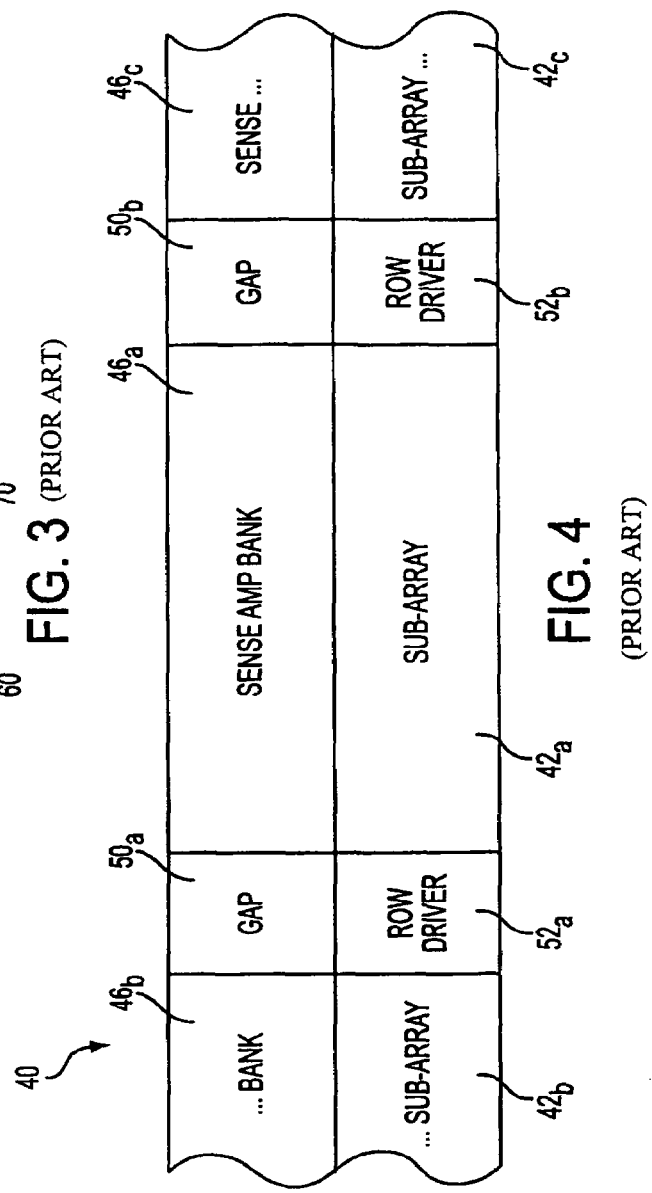
FIG. 4 is a block diagram illustrating a portion of a typical DRAM device.
Figure 5:
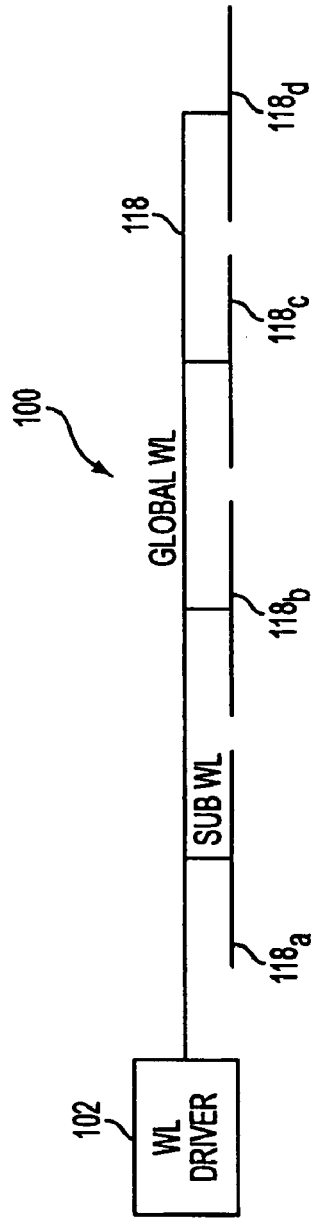
FIG. 5 is a block diagram illustrating a portion of a global word line scheme for a DRAM device.
Figure 6:
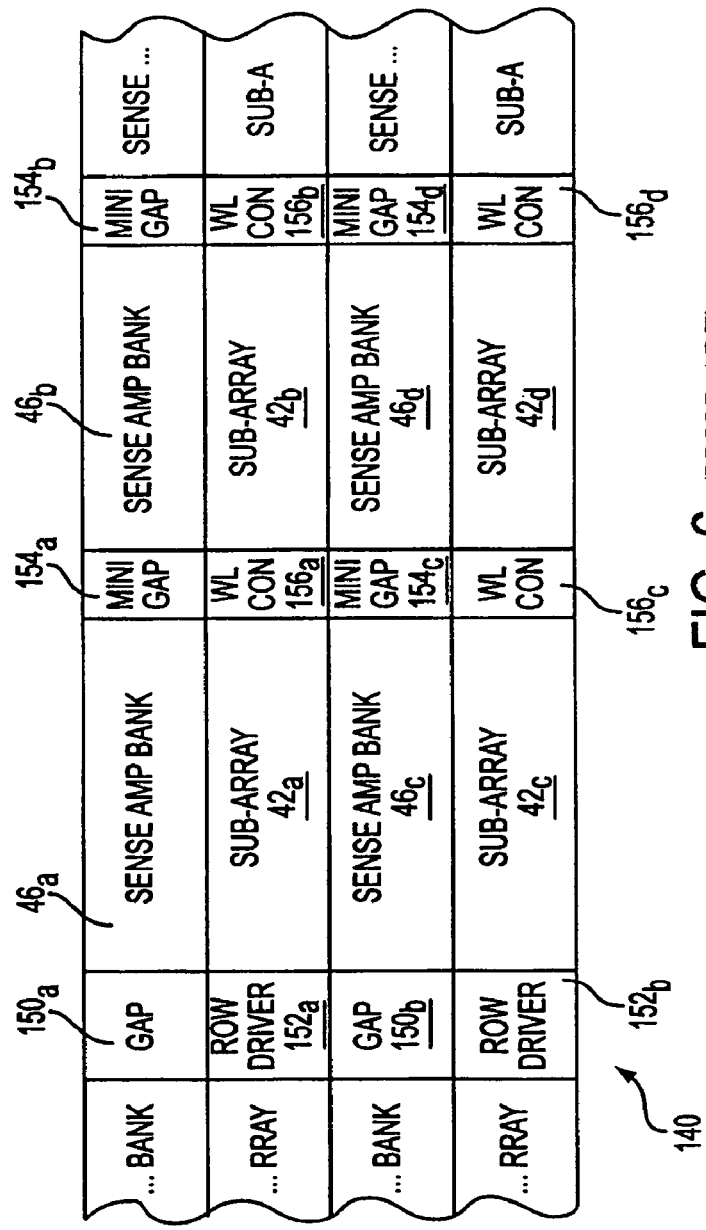
FIG. 6 is a block diagram illustrating a portion of a typical DRAM device implementing the global word line scheme illustrated in FIG. 5.

The illustrated device 340 implements the global word line scheme. Thus, it contains large row decoder/drivers 352$_a$, 352$_b$ (rather than the multiple repetitive decoders/drivers 52$_a$, 52$_b$ illustrated in FIG. 4), sub-arrays 42$_a$, 42$_b$, 42$_c$, 42$_d$, 42$_e$, 42$_f$, 42$_g$, 42$_h$ of memory cells, gaps 350$_a$, 350$_b$, word line contact blocks 156$_a$, 156$_b$, 156$_c$, 156$_d$ and mini-gaps 354$_a$, 354$_b$, 354$_c$, 354$_d$. The gaps 350$_a$, 350$_b$ are physically adjacent to and located over the row decoder/drivers 352$_a$, 352$_b$ while the mini-gaps 354$_a$, 354$_b$, 354$_c$, 354$_d$ are physically adjacent to and located over the word line contact blocks 156$_a$, 156$_b$, 156$_c$, 156$_d$.

It should be noted that the RNL* driver embedded sense amplifier banks 146$_a$, 146$_b$, 146$_c$, 146$_d$ will supply the n-sense amplifier activation signal RNL* to the ACT driver embedded sense amplifier banks 246$_a$, 246$_b$, 246$_c$, 246$_d$ through a bus or contact blocks. This alleviates the need for the ACT driver embedded sense amplifier banks 246$_a$, 246$_b$, 246$_c$, 246$_d$ to have their own RNL* driver. Similarly, the ACT driver embedded sense amplifier banks 246$_a$, 246$_b$, 246$_c$, 246$_d$ will supply the p-sense amplifier activation signal ACT to the RNL* driver embedded sense amplifier banks 146$_a$, 146$_b$, 146$_c$, 146$_d$ through a bus or contact blocks. This alleviates the need for the RNL* driver embedded sense amplifier banks 146$_a$, 146$_b$, 146$_c$, 146$_d$ to have their own ACT driver. Thus, the illustrated embodiment does not require RNL* or ACT drivers 191, 293 within the gaps 350$_a$, 350$_b$ or mini-gaps 354$_a$, 354$_b$, 354$_c$, 354$_d$ of the device 340.

The first mini-gap 354$_a$ separates the first RNL* driver embedded sense amplifier bank 146$_a$ from the first ACT driver embedded sense amplifier bank 246$_a$. The second mini-gap 354$_b$ separates the first ACT driver embedded sense amplifier bank 246$_a$ from the third RNL* driver embedded sense amplifier bank 146$_c$. The third mini-gap 354$_c$ separates the second RNL* driver embedded sense amplifier bank 146$_b$ from the second ACT driver embedded sense amplifier bank 246$_b$. The fourth mini-gap 354$_d$ separates the second ACT driver embedded sense amplifier bank 246$_b$ from the fourth RNL* driver embedded sense amplifier bank 146$_d$.

Across the mini-gaps 354$_a$, 354$_b$, 354$_c$, 354$_d$, the RNL* driver embedded sense amplifier banks 146$_a$, 146$_b$, 146$_c$, 146$_d$ and ACT driver embedded sense amplifier banks 246$_a$, 246$_b$, 246$_c$, 246$_d$ are spaced far enough apart such that the above-described n-well width problems are resolved. Since the mini-gaps 354$_a$, 354$_b$, 354$_c$, 354$_d$ align with word line contact blocks 156$_a$, 156$_b$, 156$_c$, 156$_d$, the n-well width problems are resolved using existing chip area. That is, by alternating RNL* driver embedded sense amplifier banks 146$_a$, 146$_b$, 146$_c$, 146$_d$ and ACT driver embedded sense amplifier banks 246$_a$, 246$_b$, 246$_c$, 246$_d$ in the horizontal direction extra spacing between the driver transistors is not required. As such, the illustrated embodiment of the invention can implement large ACT and RNL* drivers without wasting precious area on the device 340.

Another advantage of the illustrated embodiment is that the gaps 350$_a$, 350$_b$ and mini-gaps 354$_a$, 354$_b$, 354$_c$, 354$_d$ do not contain RNL* and ACT driver circuitry. Thus, the gaps 350$_a$, 350$_b$ and mini-gaps 354$_a$, 354$_b$, 354$_c$, 354$_d$ have room for other functions required by the device 340. These functions may include the circuitry needed to drive the RNL* to Vcc/2 and/or ACT to ground during the precharge operations (described above with respect to FIGS. 7 and 8). In addition, power straps, substrate and well contact blocks could be implemented in the gaps 350$_a$, 350$_b$ and mini-gaps 354$_a$, 354$_b$, 354$_c$, 354$_d$. This may be problematic in the conventional DRAM devices.

Figure 10:
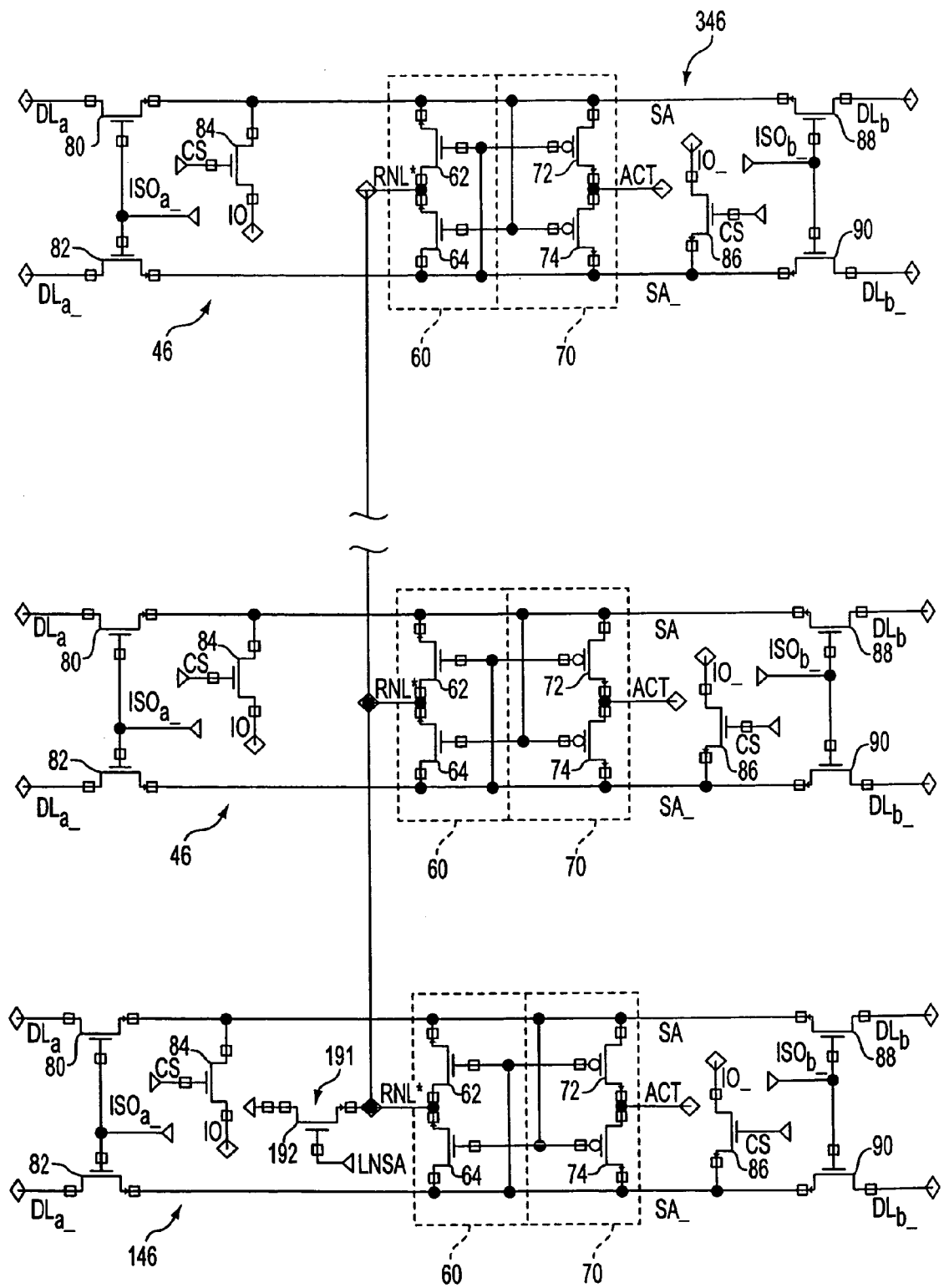
FIG. 10 is a circuit diagram illustrating a portion of an exemplary bank of sense amplifiers constructed in accordance with another embodiment of the invention.

FIG. 10 is a circuit diagram illustrating a portion of an exemplary bank of RNL* driver embedded sense amplifiers 346 constructed in accordance with another embodiment of the invention. The illustrated bank 346 comprises one RNL* driver embedded sense amplifier 146 and a plurality of conventional sense amplifiers 46. The total number of sense amplifiers 46, 146 can be two hundred and fifty-six, but it should be appreciated that the invention is not limited to any specific number of sense amplifiers 46, 146. In the illustrated embodiment, one RNL* driver 191 is used to generate the n-sense amplifier activation signal RNL* for all of the sense amplifiers 46, 146 in the bank 346. The same n-sense amplifier activation signal RNL* can be routed to ACT embedded sense amplifiers if needed. Thus, the illustrated bank 346 need only incorporate one driver 191 to activate numerous n-sense amplifiers 60.

It should be appreciated that one RNL* driver 191 could be used to generate the n-sense amplifier activation signal RNL* for two, four, eight or more of the sense amplifiers 46, 146 in the bank 346 (but less than all of the sense amplifiers 46, 146). In which case the bank 346 would have multiple drivers 191, but fewer than one per sense amplifier 46, 146, with each driver 191 being connected to N number of sense amplifier 46, 146, where N is greater than 1.

Figure 11:
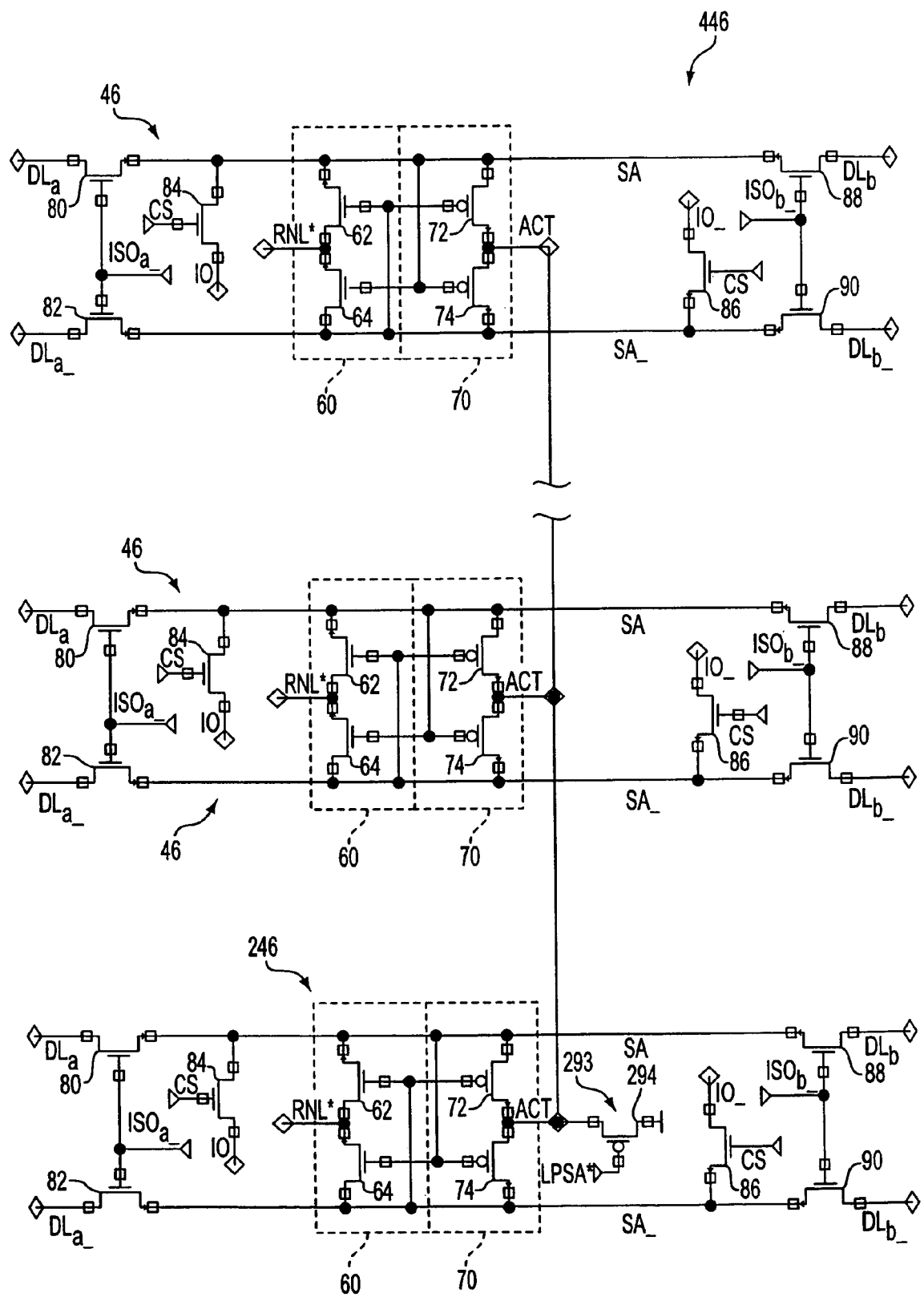
FIG. 11 is a circuit diagram illustrating a portion of another exemplary bank of sense amplifiers constructed in accordance with another embodiment of the invention.

FIG. 11 is a circuit diagram illustrating a portion of an exemplary bank of ACT driver embedded sense amplifiers 446 constructed in accordance with another embodiment of the invention. The illustrated bank 446 comprises one ACT driver embedded sense amplifier 246 and a plurality of conventional sense amplifiers 46. The total number of sense amplifiers 46, 246 can be two hundred and fifty-six, but it should be appreciated that the invention is not limited to any specific number of sense amplifiers 46, 246. In the illustrated embodiment, one ACT driver 293 is used to generate the p-sense amplifier activation signal ACT for all of the sense amplifiers 46, 246 in the bank 446. The same p-sense amplifier activation signal ACT can be routed to RNL* embedded sense amplifiers if needed. Thus, the illustrated bank 446 need only incorporate one driver 293 to activate numerous p-sense amplifiers 70.

It should be appreciated that one ACT driver 293 could be used to generate the p-sense amplifier activation signal ACT for two, four, eight or more of the sense amplifiers 46, 246 in the bank 446 (but less than all of the sense amplifiers 46, 246). In which case the bank 446 would have multiple drivers 293, but fewer than one per sense amplifier 46, 246, with each driver 293 being connected to N number of sense amplifier 46, 346, where N is greater than 1.

Thus, the embodiments of the invention physically alternate banks having embedded RNL* and ACT drivers. In doing so, large RNL* and ACT drivers can be used since the sense amplifier bank has more room for the drivers then the mini-gaps. Proper sizing of these drivers will improve sense amplifier operation and operation of the DRAM device itself. In addition, by using the global word line scheme the bus size for the n-sense amplifier activation signal RNL* and p-sense amplifier activation signal ACT can be very small, which leaves more area on the chip for power buses and other control signals routed over the sense amplifiers. Another benefit of the invention is that the gaps and mini-gaps have room for other functions required by the DRAM device. These functions may include the circuitry needed to drive the RNL* ACT signals during the precharge operations.

It should also be noted that the invention is not limited to the illustrated drivers 191, 293. That is, it is possible to have an RNL* driver 191 that uses p-channel MOSFET transistors or an ACT driver 293 that uses n-channel MOSFET transistors if the application warranted such a use. Thus, the invention is not to be limited solely to the illustrated n-channel RNL* driver 191 and p-channel ACT driver 293.

Figure 12:
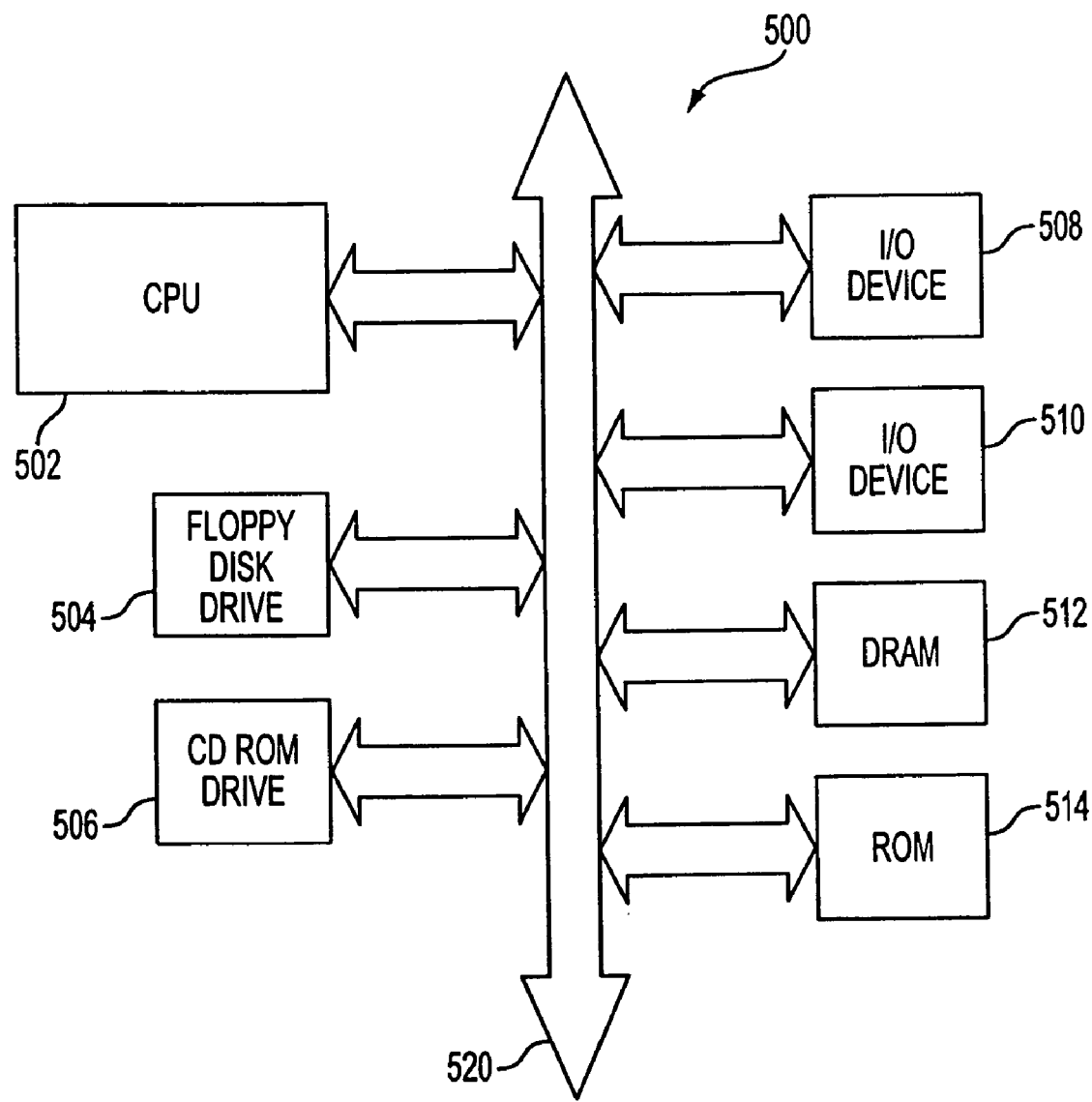
FIG. 12 is a block diagram illustrating a processor system utilizing a DRAM constructed in accordance with the exemplary embodiments of the invention.

FIG. 12 illustrates a processor system 500 incorporating a DRAM memory circuit 512 constructed in accordance with an embodiment of the invention. That is, the DRAM memory circuit 512 comprises one of the physically alternating sense amplifier driver schemes explained above with respect to FIGS. 9–11. The system 500 may be a computer system, a process control system or any other system employing a processor and associated memory.

The system 500 includes a central processing unit (CPU) 502, e.g., a microprocessor, that communicates with the DRAM memory circuit 512 and an I/O device 508 over a bus. 520. It must be noted that the bus 520 may be a series of buses and bridges commonly used in a processor system, but for convenience purposes only, the bus 520 has been illustrated as a single bus. A second I/O device 510 is illustrated, but is not necessary to practice the invention. The system 500 may also include additional memory devices such as a read-only memory (ROM) device 514, and peripheral devices such as a floppy disk drive 504 and a compact disk (CD) ROM drive 506 that also communicates with the CPU 502 over the bus 520 as is well known in the art. It should be noted that the memory 512 may be embedded on the same chip as the CPU 502 if so desired.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed is:

1. A method of manufacturing a dynamic random access memory device, said method comprising the acts of:

fabricating a first bank of sense amplifiers, each sense amplifier comprising a first type of sense amplifier and a second type of sense amplifier; and fabricating a second bank of sense amplifiers, each sense amplifier comprising a first type of sense amplifier and a second type of sense amplifier, wherein said first bank of sense amplifiers is fabricated to include at least one first driver circuit for activating said first type of sense amplifier in said first and second banks, and said second bank of sense amplifiers is fabricated to include at least one second driver circuit for activating said second type of sense amplifier in said first and second banks.

2. The method of claim 1, wherein said first bank is fabricated to comprise a plurality of first driver circuits coupled to the first type of sense amplifiers in said first bank.

3. method of claim 2, wherein each first driver circuit is associated with and connected to a respective first type of sense amplifier in said first bank.

4. method of claim 1, wherein said second bank is fabricated to comprise a plurality of second driver circuits coupled to the second type of sense amplifiers in said second bank.

5. The method of claim 4, wherein each second driver circuit is associated with and connected to a respective second type of sense amplifier in said second bank.

6. The method of claim 1, wherein said first bank is fabricated to comprise a single first driver circuit that is electrically connected to all of said first type of sense amplifier in said first bank.

7. The method of claim 1, wherein said second bank is fabricated to comprise a single second driver circuit that is electrically connected to all of said second type of sense amplifier in said second bank.

8. The method of claim 1, wherein said first bank is fabricated to comprise a plurality first driver circuits, wherein each first driver circuit is electrically connected to N number of said first type of sense amplifier in said first bank, where N is greater than 1.

9. The method of claim 1, wherein said second bank is fabricated to comprise a plurality second driver circuits, wherein each second driver circuit is electrically connected to N number of said second type of sense amplifier in said second bank, where N is greater than 1.

10. The method of claim 1, further comprising the act of forming a gap between said first and second banks, said gap comprising circuitry for providing at least one function required by said memory device.

11. A method of fabricating a memory device, said method comprising the acts of:

fabricating a plurality of memory cells organized into sub-arrays; and fabricating a plurality of first and second banks of sense amplifiers for latching and amplifying memory cells in said sub-arrays, each sense amplifier comprising a first type of sense amplifier and a second type of sense amplifier, each first bank of sense amplifiers including at least one first driver circuit for activating said first type of sense amplifier in said first bank, each second bank of sense amplifiers including at least one second driver circuit for activating said second type of sense amplifier in said second bank, and wherein said plurality of first and second banks are physically alternated in a horizontal direction throughout said device.

12. The method of claim 11, wherein said first bank is fabricated to comprise a plurality of first driver circuits coupled to the first type of sense amplifiers in said first bank.

13. The method of claim 12, wherein each first driver circuit is associated with and connected to a respective first type of sense amplifier in said second bank.

14. The method of claim 11, wherein said second bank is fabricated to comprise a plurality of second driver circuits coupled to the second type of sense amplifiers in said second bank.

15. The method of claim 14, wherein each second driver circuit is associated with and connected to a respective second type of sense amplifier in said first bank.

16. The method of claim 11, wherein said first bank is fabricated to comprise a single first driver circuit that is electrically connected to all of said first type of sense amplifier in said first bank.

17. The method of claim 11, wherein said second bank is fabricated to comprise a single second driver circuit that is electrically connected to all of said second type of sense amplifier in said second bank.

18. The method of claim 11, wherein said first bank is fabricated to comprise a plurality first driver circuits, wherein each first driver circuit is electrically connected to N number of said first type of sense amplifier in said first bank, where N is greater than 1.

19. The method of claim 11, wherein said second bank is fabricated to comprise a plurality second driver circuits, wherein each second driver circuit is electrically connected to N number of said second type of sense amplifier in said second bank, where N is greater than 1.

20. The method of claim 11, further comprising the act of fabricating a gap between said first and second banks, said gap comprising circuitry for providing at least one function required by said memory device.

* * * * *

UNITED STATES PATENT AND TRADEMARK OFFICE
CERTIFICATE OF CORRECTION

PATENT NO. : 6,961,272 B2  
DATED : November 1, 2005  
INVENTOR(S) : John Schreck It is certified that error appears in the above-identified patent and that said Letters Patent is hereby corrected as shown below:

Column 4,
Line 7, "there is exists" should read -- there exists --;

Column 7,
Line 22, "$354_b$, $254_c$, $354_d$," should read -- $354_b$, $354_c$, $354_d$, --;

Column 10,
Line 34, "plurality first" should read -- plurality of first --;
Line 39, "plurality second" should read -- plurality of second --;

Column 12,
Line 2, "plurality first" should read -- plurality of first --; and
Line 7, "plurality second" should read -- plurality of second --.

Signed and Sealed this

Fourteenth Day of February, 2006

JON W. DUDAS
*Director of the United States Patent and Trademark Office*